US008253168B2

(12) United States Patent
Miller et al.

(10) Patent No.: US 8,253,168 B2
(45) Date of Patent: Aug. 28, 2012

(54) TRANSISTORS FOR REPLACING METAL-OXIDE-SEMICONDUCTOR FIELD-EFFECT TRANSISTORS IN NANOELECTRONICS

(75) Inventors: Mark S. Miller, Salt Lake City, UT (US); Justin B. Jackson, Salt Lake City, UT (US); Divesh Kapoor, Salt Lake City, UT (US); Justin Millis, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 191 days.

(21) Appl. No.: 12/826,480

(22) Filed: Jun. 29, 2010

(65) Prior Publication Data

US 2010/0264425 A1 Oct. 21, 2010

Related U.S. Application Data

(62) Division of application No. 12/141,473, filed on Jun. 18, 2008, now Pat. No. 7,772,056.

(60) Provisional application No. 60/936,207, filed on Jun. 18, 2007.

(51) Int. Cl.
*H01L 29/808* (2006.01)

(52) U.S. Cl. ............... 257/192; 257/279; 257/E21.448; 438/188; 438/191

(58) Field of Classification Search .................. 438/188, 438/191, FOR. 194; 257/E21.448, 192, 279
See application file for complete search history.

(56) References Cited

U.S. PATENT DOCUMENTS

| 4,329,700 | A | | 5/1982 | Tanaka | |
|---|---|---|---|---|---|
| 4,379,005 | A | * | 4/1983 | Hovel et al. | 438/571 |
| 4,538,165 | A | * | 8/1985 | Chang et al. | 257/192 |
| 4,601,095 | A | | 7/1986 | Kikuchi et al. | |
| 4,700,461 | A | | 10/1987 | Choi et al. | |
| 4,962,409 | A | * | 10/1990 | Solomon | 257/192 |
| 5,015,596 | A | | 5/1991 | Toyoda et al. | |
| 5,130,770 | A | | 7/1992 | Blanc et al. | |
| 5,161,235 | A | * | 11/1992 | Shur et al. | 257/24 |
| 5,479,033 | A | * | 12/1995 | Baca et al. | 257/192 |
| 5,866,925 | A | * | 2/1999 | Zolper et al. | 257/279 |
| 6,307,223 | B1 | | 10/2001 | Yu | |
| 7,504,676 | B2 | | 3/2009 | Bhalla et al. | |
| 7,569,873 | B2 | | 8/2009 | Kapoor | |
| 7,598,547 | B2 | | 10/2009 | Pendharker et al. | |
| 7,605,412 | B2 | | 10/2009 | Hower et al. | |
| 7,670,888 | B2 | | 3/2010 | Hao et al. | |
| 7,728,355 | B2 | * | 6/2010 | Beach et al. | 257/194 |
| 2002/0123174 | A1 | * | 9/2002 | Casady et al. | 438/135 |

(Continued)

OTHER PUBLICATIONS

Stanley Leonard Hurst, Vlsi Custom Microelectronics: Digital, Analog, and Mixed-Signal, CRC Press, pp. 42-45, 1998.

(Continued)

*Primary Examiner* — George Fourson, III
(74) *Attorney, Agent, or Firm* — Fulbright & Jaworski L.L.P.

(57) ABSTRACT

Junction field effect transistors (JFETs) are shown to be a viable replacement for metal oxide semiconductor field effect transistors (MOSFETs) for gate lengths of less than about 40 nm, providing an alternative to the gate leakage problems presented by scaled down MOSFETs. Integrated circuit designs can have complementary JFET (CJFET) logic cells substituted for existing MOSFET-based logic cells to produce revised integrated circuit designs. Integrated circuits can include JFETS where the channel comprises a wide bandgap semiconductor material and the gate comprises a narrow bandgap semiconductor material. Mixtures of JFET and MOSFET transistors can be included on an integrated circuit design.

13 Claims, 7 Drawing Sheets

U.S. PATENT DOCUMENTS

| | | |
|---|---|---|
| 2005/0040792 A1 | 2/2005 | Nair |
| 2005/0247955 A1 | 11/2005 | Howard et al. |
| 2006/0226443 A1* | 10/2006 | Ryu et al. ............ 257/192 |
| 2007/0008038 A1 | 1/2007 | Klepser et al. |
| 2007/0096144 A1 | 5/2007 | Kapoor |
| 2007/0170463 A1* | 7/2007 | Ueno et al. ............ 257/192 |
| 2007/0170537 A1 | 7/2007 | Poenar et al. |
| 2008/0024188 A1 | 1/2008 | Chou et al. |
| 2008/0100342 A1 | 5/2008 | Mulbacher et al. |

OTHER PUBLICATIONS

Zolper, J C et al. "An All-Implanted, Self-Aligned, GaAs JFET with a Nonalloyed W/p+-GaAs Gate Contact" IEEE Transactions on Electron Devices, vol. 41, No. 7, Jul. 1994, pp. 1078-1082.

* cited by examiner

TRANSISTORS FOR REPLACING METAL-OXIDE-SEMICONDUCTOR FIELD-EFFECT TRANSISTORS IN NANOELECTRONICS

PRIORITY CLAIM

The present application is a divisional of U.S. patent application Ser. No. 12/141,473, filed Jun. 18, 2008, which claims the benefit of U.S. Provisional Patent Application Ser. No. 60/936,207, filed Jun. 18, 2007, each of which are entitled "Transistors for Replacing Metal-Oxide Semiconductor Field-Effect Transistors in Nanoelectronics" and each of which is hereby incorporated by reference.

FIELD OF THE INVENTION

The present invention relates generally to integrated circuits. More particularly, the present application relates to transistors used in integrated circuits.

BACKGROUND

A significant trend in the electronics industry is the downward size scaling of integrated circuits. Reducing the size of transistors in an integrated circuit enables reduced cost, improved performance, and more complex integrated circuits.

The trend of reducing transistor size, however, may be approaching significant limitations. A particular concern is the gate leakage currents of the widely prevalent metal-oxide-semiconductor field-effect transistors (MOSFETs). MOSFETs are a mainstay of the microelectronics industry and are widely used, particularly as complementary pairs within digital logic circuits. Unfortunately, as MOSFETs are scaled down, gate leakage currents rise exponentially with decreasing gate oxide (insulator) thickness. While various techniques, such as substituting higher dielectric constant materials for the gate insulator, and increasing the gate insulator thickness relative to other dimensions can mitigate some of the problems, gate leakage current-density in small MOSFETs (e.g., 35 nm and below) may become problematic. Modifications to MOSFET designs to address gate leakage can also involve additional complex processing steps, increasing costs, and making scaling less viable. Accordingly, scaling down MOSFETs has become increasingly difficult and expensive.

SUMMARY

Accordingly, it has been recognized that there is a need for a suitable transistor structure than can replace MOSFETs in integrated circuits that does not exhibit the same scaling problems as MOSFETs.

In some embodiments of the present invention, an integrated circuit can be designed by substituting complementary junction field effect (CJFET) transistors for MOSFET transistors. Logic cells can be defined using CJFETs to provide a cell library. An integrated circuit design can be revised by substituting CJFET-based cells for MOSFET-based cells.

In some embodiments of the present invention, an integrated circuit can be fabricated by forming complementary pairs on the wafer, where the complementary pairs include at least one junction field effect transistor (JFET). Fabricating the JFET can include defining a channel region, a gate region, and defining a source and drain using ion implantation wherein the gate masks the channel region in a self-aligned gate process.

In some embodiments of the present invention, an integrated circuit can include a plurality of interconnected logic gates, wherein at least one of the logic gates comprises a pair of CJFETs. The CJFETs can include a channel comprising a wide bandgap semiconductor material and a gate comprising a narrow bandgap semiconductor material.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

It is to be understood that the singular forms "a," "an," and "the" include plural referents unless the context clearly dictates otherwise. Thus, for example, reference to "a region" includes reference to one or more of such regions.

As used herein, the term "about" means that dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 10 micrometers to about 50 micrometers" should be interpreted to include not only the explicitly recited values of about 10 micrometer to about 50 micrometers, but also to include individual values and sub-ranges within the indicated range. Thus, included in this numerical range are individual values such as 20, 35, and 45 and sub-ranges such as from 10-30, from 20-45, and from 30-50, etc.

Conventional integrated circuits typically use metal-oxide-semiconductor field-effect transistors (MOSFETs) as their principle transistor building block. For example, digital logic is typically implemented using complementary pairs of MOSFETs. Increasing circuit density and performance can often be achieved by perform a scaling operation, where the size of the transistors are scaled downward. Unfortunately, as mentioned above, as MOSFETs are scaled downward, gate leakage due to tunneling through thin gate oxides has become a major design constraint. The gate leakage current-density increases approximately exponentially with decreasing oxide thickness. While thicker gate insulators with higher dielectric constants (e.g., higher than $SiO_2$) have mitigated this problem to some extent, subsequent scaling still encounters this exponential dependence.

In contrast, it has been observed by the present inventors that the leakage current-density in junction field effect transistors does not behave in the same way as MOSFETs. Traditionally, junction field effect transistors (JFET) have not been considered a suitable replacement for MOSFETs. For complementary logic, JFETs are typically enhancement mode devices, turning on with forward-biased gate pn-junctions. Such currents, and the consequent restrictions on gate voltages, have historically made these transistors non-competitive for large-scale integrated circuits. However, scaling a JFET to smaller dimensions can actually decrease the gate current density somewhat, because the scaled-up doping concentrations reduce the junction saturation currents. Moreover, with the trend towards using lower voltage levels, on-chip logic levels are decreasing into the range of pn-junction turn-on voltages. Accordingly, for sufficiently small scale device, complementary JFET circuitry can provide lower gate leakage, and thus be a better basic building block. The crossover point in gate length at which JFETs provide lower leakage than MOSFETS depends on the details of the MOSFET and JFET scaling and functional requirements as the follow analysis helps to demonstrate.

For a desired maximum transistor gate current density, a minimum gate length L for MOSFETs can be estimated. For moderate performance integrated circuits, for example those used in desktop applications, a conservative limit on gate current density is about 1 $A/cm^2$. For a MOSFET with a silicon dioxide gate insulator and a gate potential of 1 V, the leakage reaches 1 $A/cm^2$ when the oxide thickness scales to about 1.7 nm. This silicon dioxide thickness corresponds to a transistor length of about L≈70 nm. Smaller lengths can be achieved using higher dielectric constant materials, and recent production technologies at the 65 nm technology node typically use silicon oxynitride gate insulators, with one example having a 35 nm gate length, though its 1.2 nm insulator was not scaled from the preceding 90 nm technology node because of gate leakage. In order to address gate leakage, the emerging 45 nm node technologies may use hafnia-based gate dielectrics for gate lengths of approximately 25 nm. Unfortunately, changing to alternative oxide formulations can entail making a number of changes in the fabrication processing, with the attendant challenges and risks that this presents.

While JFETs are useful in a number of applications, the scaling properties of enhancement mode JFETs and the consequences for complementary logic appear to have received little attention in the literature. Electrically, JFETs behave similarly to corresponding MOSFETs, and they also benefit from lower input capacitance and lower noise. Because of these properties, some applications favor JFETs over MOSFETs, for example as the low-noise front ends for charge sensing amplifiers. For integrated circuits, complementary enhancement mode silicon JFETs can also provide greater resistance to radiation damage. Substitution of JFETs for MOSFETs in digital logic, however, does not appear to have previously been considered feasible for a variety of reasons.

Scaling analysis performed by the present inventors shows that the substitution of JFETs for MOSFETs appears to be practical, however, and that leakage currents of JFETs may be considerably lower than comparable-sized MOSFETs for sufficiently small devices. For JFETs, a simple, one-sided diode model can give an initial gate current density estimate. Considering a 30 nm thick, n-type neutral layer doped to $5\times10^{18}$ $cm^{-3}$ at a forward bias of 0.7 V yields a current density on the order of 1 $A/cm^2$. This has lead the present inventors to conclude that, at the sub-one-volt supplies planned for integrated circuits in the near future, JFET gate current densities can compete with MOSFET gate current densities. A more detailed scaling analysis performed by the inventors confirms this conclusion.

Figure 1:
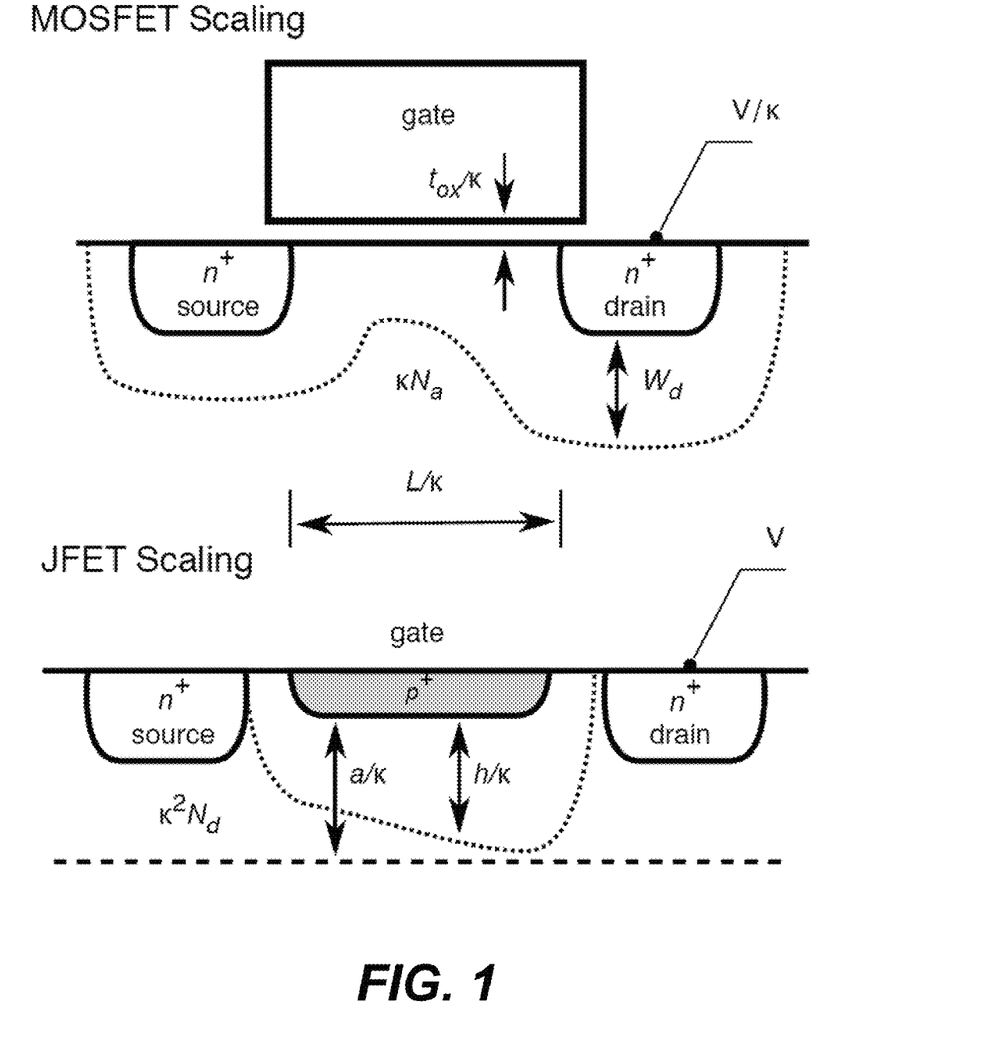
FIG. 1 is an illustration of a scaling model for comparison of a MOSFET and a JFET in accordance with some embodiments of the present invention.

FIG. 1 illustrates the scaling model used, where the dimensions scale by κ>1, and doping scales proportionally to κ for the MOSFET and proportionally to $κ^2$ for the JFET. All dimensions scale by κ>1, including the gate length L/κ and width W/κ. An oxide defines the bottom of the channel, which has a metallurgical thickness of a/κ, and h/κ is the depletion thickness into the channel. To reduce two dimensional and short-channel effects, the channel was conservatively constrained to L=2a. For numerical comparisons, the reference design has a gate length of L=50 nm, channel doping of $N_d$=1.6×$10^{18}$ $cm^{-3}$, and gate doping of $N_a$=1.6×$10^{19}$ $cm^{-3}$, which has a threshold voltage of approximately $V_t$=250 mV. These parameters were chosen, in part, to enable scaling to a viable 10 nm gate length device with minor modifications. For scaling, threshold is defined to occur when the depletion edge coincides with the channel bottom, with the drain-source potential $V_{ds}$=0. Taking the gate-channel junction to be one-sided, this happens at h=a=$\sqrt{2\epsilon_s(V_{bi}-V_g)/qN_d}$, where $V_g$ is the gate potential, $\epsilon_s$ is the semiconductor permittivity, and q is the elementary charge. The built-in potential $V_{bi}$ is larger than the non-scaled applied potentials for enhancement mode devices, and $V_{bi}$ will vary only logarithmically with doping—or even more slowly for degenerately-doped material. Consequently, the channel doping can scale proportional to $κ^2$ to accommodate the scaling of a and h. With these assumptions and scalings, the threshold voltage, $$V_t = V_{bi} - \frac{qa^2N_d}{2\epsilon_s} \qquad (1)$$

will also change slowly with scaling. Designing a particular $V_t$ entails changing both the channel thickness and doping. The forward gate current density depends on the doping and thus the gate length. A one-dimensional ideal diode model illustrates this, giving a gate current density of $$J_g = \frac{1}{\kappa} q n_i^2 \left[ \frac{D_n}{N_a W_p} + \frac{D_p}{N_d W_n} \right] (e^{V_g/V_{th}} - 1), \quad (2)$$

where $n_i$ is the intrinsic carrier concentration, $D_n$ and $D_p$ the minority carrier diffusivities, $W_n$ and $W_p$ the neutral layer widths, and $V_{th}$ the thermal potential. Consequently, in this model, and neglecting diffusivity decreases with doping, the forward gate current scales as $I_g \sim 1/\kappa^3$. At the smaller dimensions, the higher doping levels will make bandgap narrowing important, reducing the gate-channel barrier and increasing the saturation current density.

Figure 2:
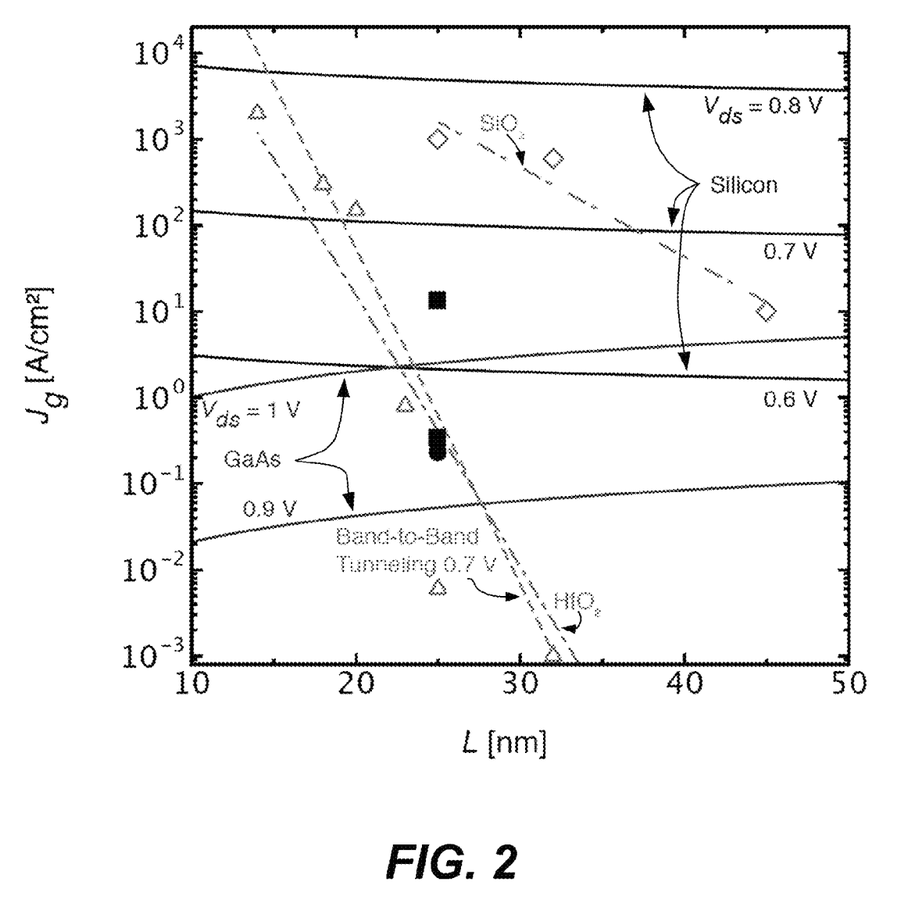
FIG. 2 is a graph showing gate current density scaling of MOSFETs and JFETS as a function of gate length in accordance with some embodiments of the present invention.

FIG. 2 provides a plot for the gate current density $J_g$ versus gate length for the scaled reference design, including bandgap narrowing, at gate potentials of $V_g=0.6, 0.7,$ and $0.8$ V (shown by solid lines) for silicon-based JFETs (GaAs-based JFETs are also shown, and are discussed further below). For comparison (and as explained further below), gate current density is shown for MOSFETs using $SiO_2$ and $HfO_2$ gate oxides by dash-dotted lines).

The neutral layer thicknesses for the reference design in this one dimensional model are $W_n=W_p=L/2$, and the minority carrier diffusivities are $D_p=4$ cm$^2$/s and $D_n=6.2$ cm$^2$/s. The gate current densities trend upwards with decreasing gate length due to bandgap narrowing, instead of following the behavior of Eq. 2. Throughout the 10 to 50 nm gate length range plotted, the gate current density for $V_g=0.6$ V is on the order of 1 A/cm$^2$, and the 0.7 V curve lies close to 100 A/cm$^2$, which spans the range of medium-performance applications. The typical JFET drain current expressions obtained in the gradual channel approximation can be cast into a second-order MOSFET-like form for enhancement mode devices. In saturation, the drain current scales as $$I_{dsat} = \frac{1}{\kappa} \frac{\varepsilon_s \mu_n}{2a} \frac{W}{L} (V_g - V_t)^2, \quad (3)$$

where $\mu_n$ is the channel electron mobility. For short channel JFETs, electron velocity saturation at $v_{sat}$ will generally be significant, for which the saturation drain current approximately becomes $$I_{dsat} \approx \frac{\varepsilon_s v_{sat} W}{a} (V_g - V_t). \quad (4)$$

With velocity saturation, the transconductance in saturation, $g_{msat} \approx \varepsilon_s v_{sat} W/a$, does not decrease with downward scaling. For the reference design in saturation with $v_{sat}=10^7$ cm/s, the transconductance per gate width is 420 mS/mm. The intrinsic gate capacitance is given by the gate-channel junction capacitance and scales as $$C_g = \kappa \frac{\varepsilon_s}{h} \approx \kappa \frac{\varepsilon_s}{a}. \quad (5)$$

The subthreshold drain current given by a one-dimensional channel barrier model is $$I_{ds} = \sqrt{\frac{\pi}{2}} \mu_n C_D \frac{W}{L} V_{th}^2 e^{-(V_{gs}-V_p)/V_{th}} (1 - e^{-V_{ds}/V_{th}}), \quad (6)$$

where $C_D$ is the extrinsic Debye length for the n-type channel doping. Neglecting changes in mobility, in this model the subthreshold current will vary with $C_D$, which scales as $\sim 1/\kappa$ because of the changing doping. This expression gives an inverse subthreshold slope of $$S = \log_{10}(e) V_{th} \approx 60 \text{ mV/decade}. \quad (7)$$

For most actual devices, though, the inverse subthreshold slope will be larger due to two-dimensional effects and to some potential drop across an underlying oxide.

At the smallest dimensions, and thus largest doping concentrations, band-to-band tunneling in the reverse-biased gate drain junction can contribute significantly to leakage. The tunneling is largest when the device is turned off with the source-drain potential equal to the voltage supply. The tunneling current density depends exponentially on the local electric field and can be estimated with a one-dimensional model using the peak electric field in the junction. FIG. 2 also includes a plot of the band-to-band tunneling current density scaling with the JFET turned off and a 0.7 V potential on the drain (dashed line). The maximum electric field used for plotting comes from the conservative assumption of an abrupt pn-junction. With this estimate, the band-to-band tunneling current becomes larger than the forward gate current density for L less than about 20 nm. An actual, graded junction can significantly reduce the maximum electric field and the tunneling current, though making such an estimate requires more device design assumptions than those of FIG. 1.

The sharpest distinction between JFETs and MOSFETs under scaling occurs for their gate currents. The MOSFET gate current leakage due to tunneling through the oxide varies approximately as $e^{-\alpha t_{ox}/\kappa}$, where $\alpha$ is a material-dependent potential barrier parameter. FIG. 2 also plots estimates of MOSFET gate current densities versus gate length for two cases of gate oxide materials, assuming either $SiO_2$ or pure, high-dielectric-constant $HfO_2$. FIG. 2 also shows experimental current densities for tunneling through $SiO_2$ layers at a gate potential of 1 V for various gate lengths (open diamonds for $SiO_2$ and open triangles for $HfO_2$) fit with an exponential dependence (dash-dotted lines). The curves in FIG. 2 thus indicate that the crossover point from MOSFET to JFET gate current densities occurs at about a 20 nm gate length for pure hafnia and at about 35 nm for silicon dioxide, assuming a 0.7 V JFET supply voltage. Generally, the oxide tunneling of actual devices is believed to lay in between the fitted curves for $SiO_2$ and $HfO_2$. This is because silicon oxynitride is typically used rather than silicon dioxide or pure hafnia as in the analysis above. Additionally, oxide tunneling data for 0.7 V shifts the MOSFET curves leftwards, but still retain the exponential dependences.

A disadvantage of the JFET with respect to a similarly-sized MOSFET is that the drain current may be somewhat lower. Comparing the JFET drain current in saturation of Eq. 3 with an analogous MOSFET square-law model that includes the body-effect coefficient m gives $$\frac{I_{ds}^{JFET}}{I_{ds}^{MOS}} = m \frac{\mu_n}{\mu_{eff}} \frac{\varepsilon_s}{\varepsilon_{ox}} \frac{t_{ox}}{a}. \quad (8)$$

Here the MOSFET inversion layer effective electron mobility is $\mu_{eff}$, and the gate oxide permittivity and thickness are $\in_{ox}$ and $t_{ox}$. For m=1.4, $t_o/a$=1/10, $\in_{ox}$=3, and equal mobilities, the idealized JFET drain current is approximately 2/5 the magnitude of a similarly sized MOSFET. This can be improved by making a smaller, while increasing $N_d$ to maintain a given threshold voltage according to Eq. 1, though at the expense of increasing band-to-band tunneling in the smallest devices.

Conversely, the JFET has an advantage of lower gate capacitance. The ratio of JFET to MOSFET intrinsic gate capacitances is $$\frac{C_g}{C_{ox}} = \frac{\varepsilon_s}{\varepsilon_{ox}} \frac{t_{ox}}{a}. \qquad (9)$$

Using the same parameter estimates as for the drain currents gives a JFET capacitance that is approximately 1/3 that of a similar MOSFET.

Table I compiles the JFET scaling results and their counterparts from a constant-field scaling of MOSFETs. Apart from the dramatic difference in gate current scalings, JFETs behave quite similarly to MOSFETs under scaling. The difference in doping scalings reflects the difference between simple constant-voltage and constant-field scaling. A more detailed generalized scaling treatment for both devices is expected to give similar doping scalings.

TABLE I

SCALING OF JFET AND MOSFET PARAMETERS AND PROPERTIES

| | Device Parameters | JFET constant V | MOSFET constant E |
|---|---|---|---|
| Scaling assumptions | Dimensions (L, W, a, $x_j$) | 1/κ | 1/κ |
| | Doping ($N_a$, $N_d$) | $κ^2$ | κ |
| | Voltage (V) | 1 | 1/κ |
| Derived device scaling parameters | Gate leakage (I) | $1/κ^3$ | $e^{-at_{ox}/κ}$ |
| | Electric field (E) | 1 | 1 |
| | Depletion width | 1/κ | 1/κ |
| | Capacitance (C) | κ | κ |
| | Channel charge per area | 1 | 1 |
| | Drain current | 1/κ | 1/κ |

Figure 3:
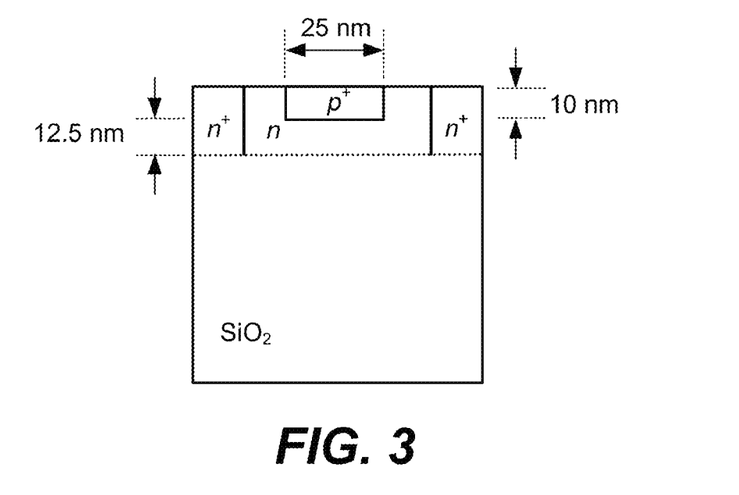
FIG. 3 is an illustration of a model for a 25 nm JFET in accordance with some embodiments of the present invention.

Turning to a specific device configuration, the properties of a simple n-channel, enhancement mode JFET model with a gate length of L=25 nm were investigated in further detail using the PADRE semiconductor device simulation tool. FIG. 3 depicts the model geometry, where a 12.5-nm-deep channel is doped to $N_d$=5.0×10$^{18}$ cm$^{-3}$, and a 25-nm-long gate extends 10 nm into the substrate and is doped to p+=1.0×10$^{20}$ cm$^{-3}$. The source and drain contacts are doped to n+=1.0× 10$^{20}$ cm$^{-3}$ and have symmetric setbacks from the gate of 10 nm. The simulated device width was W=100 nm. The back side contact to the 77.5 nm silicon dioxide was defined as p-type silicon and its potential was held at zero. The simulation took into account field and concentration-dependent mobilities, bandgap narrowing from heavy doping, band-to-band tunneling, Shockley-Reed-Hall recombination, and Fermi-Dirac statistics.

Figure 4:
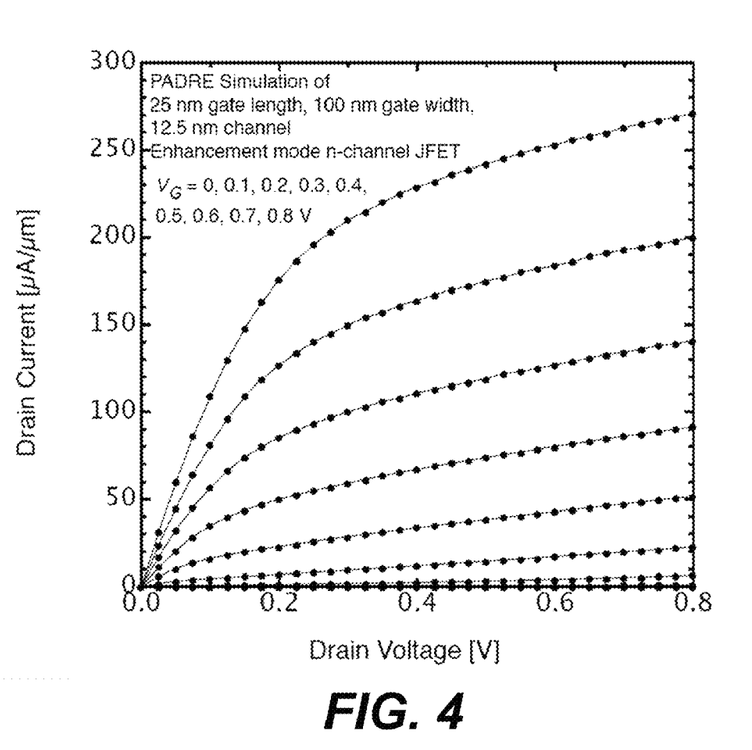
FIG. 4 is a graph showing simulated forward drain characteristics for a 25 nm JFET in accordance with some embodiments of the present invention.

Adjusting the channel doping to the value given above gave a threshold voltage of approximately 150 mV and the output characteristics of FIG. 4. Forward drain characteristics are shown for increasing gate potential in steps of 0.1 V from 0 to 0.8 V. The drain current at $V_g$=$V_{ds}$=0.7 V ($I_{on}$ for comparison purposes) is around 200 μA/μm. This simulated value of $I_{on}$ is slightly better than, but consistent with, what would be expected from the ratios of saturation currents given by the ratio in Eq. 8. Optimizing the simple 25 nm JFET design with some of the techniques discussed further below may narrow this performance difference. The transconductance at $V_g$=$V_{ds}$=0.7 V is approximately $g_m$=690 mS/mm, and the output conductance $g_{ds}$=84 mS/mm. These values give a ratio of $g_m/g_{ds}$=8.2, which is suitable for many digital logic applications.

Figure 5:
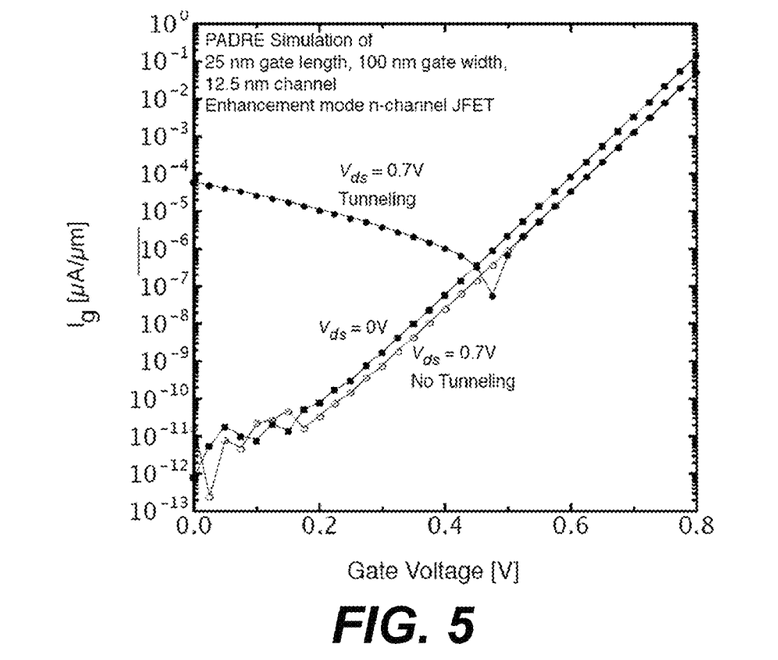
FIG. 5 is a graph showing simulated gate current versus gate voltage for a 25 nm JFET in accordance with some embodiments of the present invention.
Figure 6:
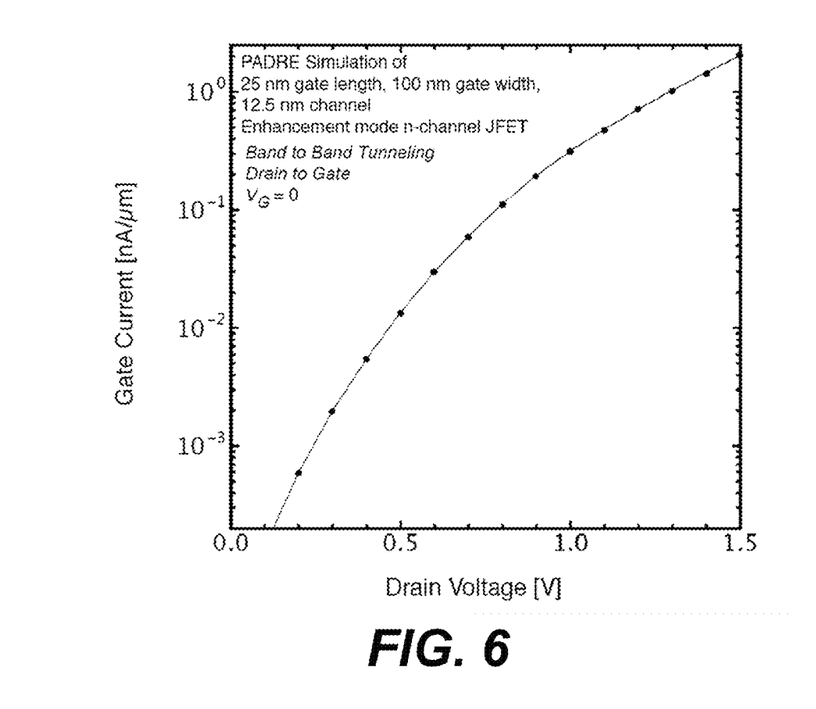
FIG. 6 is a graph showing simulated band-to-band tunneling in the reverse-biased gate-drain junction for a 25 nm JFET in accordance with some embodiments of the present invention.

FIG. 5 plots the gate current versus the gate potential for two values of the drain-source potential, $V_{ds}$=0.0 and 0.7 V. Allocating the resulting gate currents to the gate area, WL, gives the two points for $V_g$=0.6 and 0.7 V with $V_{ds}$=0.0 V, which are plotted in FIG. 2 (solid squares). These two values lie somewhat below the predictions of the scaling model of Section II. This slight discrepancy is thought to be due to a combination of the effective area being much less than the gate area with smaller lateral diffusion under the gate, larger effective neutral lengths, and possibly different minority carrier diffusivities. The two curves for the simulated gate current with $V_{ds}$=0.7 V correspond to two model runs, with and without band-to-band tunneling turned on. This allows the band-to-band tunneling at $V_g$=0 V to also be plotted (black solid circle) on the scaling axes of FIG. 2, again using the gate area to estimate the current density. The simulated tunneling current density is close to the analytic estimate. Taking the difference of the curves with and without band-to-band tunneling gives the curve of FIG. 6, showing simulated band-to-band tunneling in the reverse-biased gate-drain junction. The point at 0.7 V gives a tunneling current of 60 pA per micron of gate length.

Figure 7:
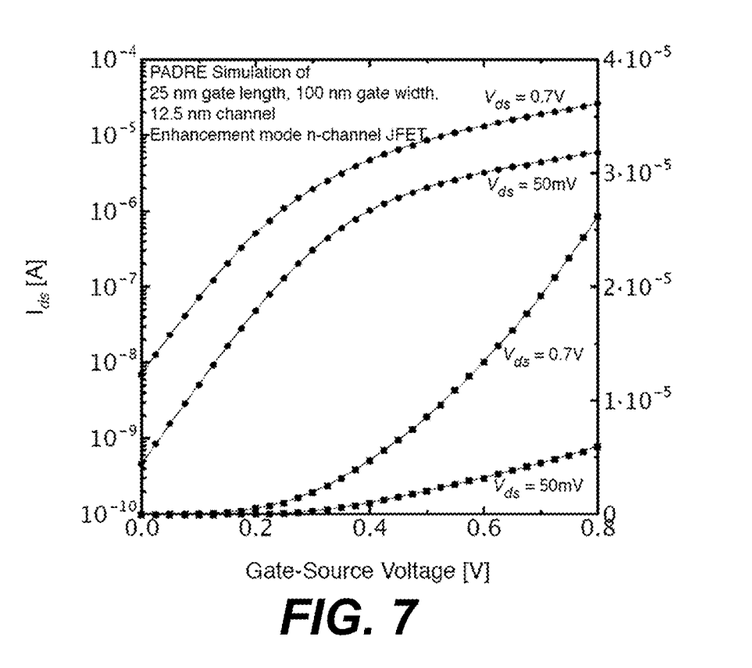
FIG. 7 is a graph showing simulated transfer characteristics for a 25 nm JFET in accordance with some embodiments of the present invention.

FIG. 7 gives the transfer characteristics for the 25 nm JFET model. At $V_{ds}$=0.7 V, $I_{off}$=60 nA/μm. This off current is much larger than the band-to-band tunneling current, consistent with the off current being a subthreshold diffusion current. The $I_{on}/I_{off}$ ratio of 3.5×10$^3$ is half the experimental value of 7×10$^3$ reported by for one 25 nm nMOSFET. The simulated JFET shows a 90 to 100 mV/decade inverse subthreshold slope. The simulated transfer characteristics of FIG. 7 exhibit the short-channel effect of drain induced barrier lowering (DIBL). Using the threshold voltage shift between 0.05 V and 0.7 V rail voltages of approximately 0.075 V, gives a DIBL of approximately 115 mV/V.

Some straightforward improvements to the simple 25 nm design can increase the on drain current, reduce the leakage currents, and reduce the footprint. Referring to Eq. 3 for guidance, decreasing the channel thickness a increases the on current, and the threshold voltage can remain the same provided $N_d$ increases to keep the product $a^2 N_d$ constant. FIG. 5 shows that the greatest gate current flows for large gate bias and small source-drain potential, as would be found in an inverter with a high input. About half of this current flows through the end faces of the p-gate region. Forming the gate instead by depositing a heavily doped polycrystalline silicon gate directly on the channel, using techniques similar to those used for BJT emitters can reduce the junction area and current. Such a raised gate can also similarly reduce band-to-band tunneling at the drain end of the gate and reduce gate-source and gate-drain capacitances. The polycrystalline silicon raised gate also facilitates a self-aligned gate process similar to that used for MOSFETs. Reducing the source and drain contact setbacks can reduce the device footprint, until band-to-band tunneling at the gate-drain junction becomes prohibitive. Engineering the lateral doping gradient between the gate and drain can reduce the maximum electric field and consequently the tunneling, allowing a shorter setback, and the setbacks can be asymmetric, with a smaller source-gate setback.

From the above, it is clear that silicon JFETs can provide comparable or lower leakage currents than MOSFETs when scaled down to small lengths. While the crossover point at which JFETs are suitable replacements for MOSFETs may depend on the application and specific geometries of the devices, it is currently anticipated that replacement of MOSFETs with JFETS may be desirable for gate lengths of less than about 40 nm, less than about 30 nm, or particularly less than about 25 nm. In particular, gate lengths between about 10 nm and about 25 nm are expected to provide particularly useful.

Additionally, the great geometric similarity of the two devices' layouts, and the materials and fabrication process compatibilities, can confer an advantage to the JFETs over some other devices under consideration for MOSFET replacement, as the impacts on the system architecture would likely be modest. For example, the JFET can be arranged so that the overall extent and positions of the source, drain, and gate terminals are the same as the MOSFET, allowing a straightforward substitution within a cell library.

Figure 8:
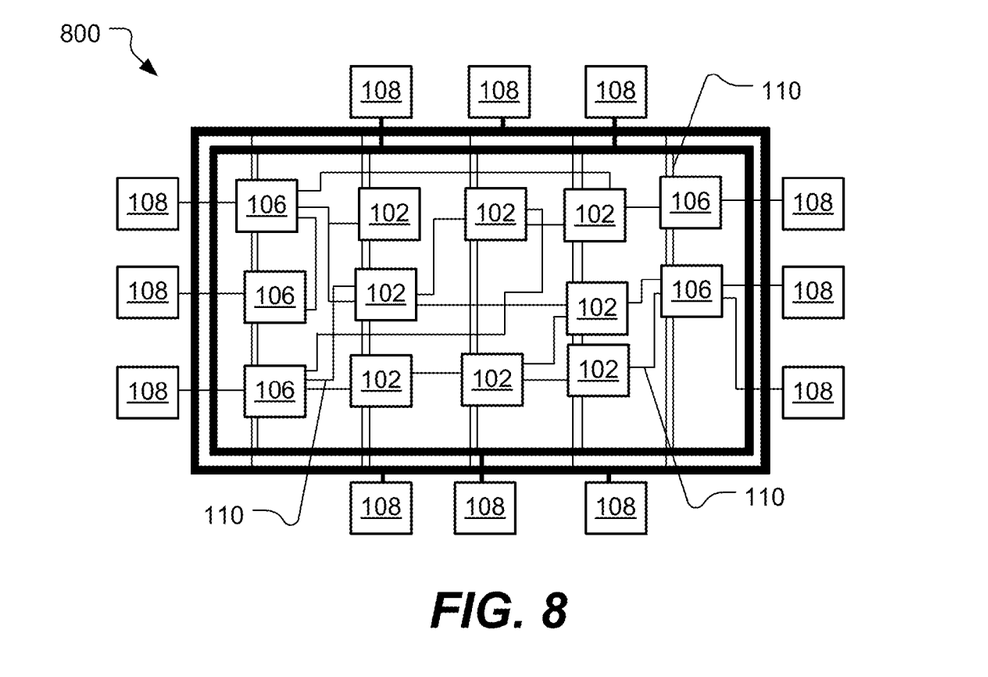
FIG. 8 is an illustration of an integrated circuit in accordance with some embodiments of the present invention.
Figure 9:
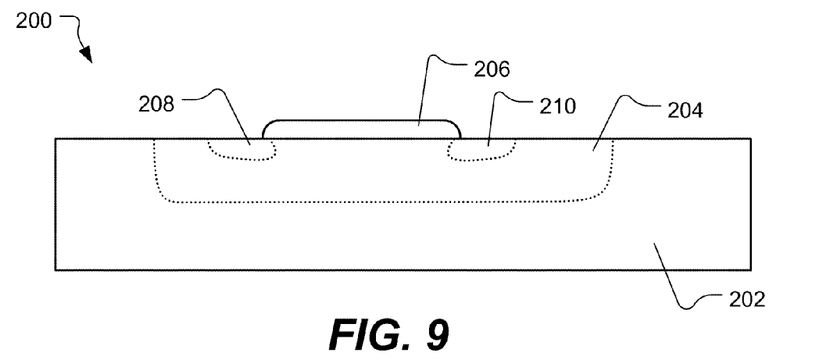
FIG. 9 is a side cross-sectional view of a junction field effect transistor in accordance with some embodiments of the present invention.

Accordingly, FIG. 8 illustrates an integrated circuit in accordance with some embodiments of the present invention. The integrated circuit, shown generally at 100, comprises a plurality of interconnected logic gates 102. For example, logic gates can correspond to predefined arrangements of transistors and other circuit components. The integrated circuit can also include other structures, such as power supply distribution rails 104, input/output cells 106 coupled to bond pads 108, analog circuitry (not shown), similar elements known in the art, etc. Interconnection between logic gates and between logic gates and other structures can be provided by conductive traces 110, for example, of aluminum or copper placed on two or more layers.

The logic gates 102 can be implemented in a variety of technologies. At least one of the logic gates can include a complementary pair of junction field effect transistors (CJFETs). For example, as shown in FIG. 2, a junction field effect transistor 200 can be fabricated on a wafer 202, and can include a channel 204 formed from a wide bandgap semiconductor material and a gate 206 formed form a narrow bandgap semiconductor. This combination of materials can help to reduce leakage caused by band-to-band tunneling. Source 208 and drain 210 are also shown, and may include, for example, non uniform doping, or doping extending under the gate, for example, achieved by halo implantation.

By way of example, a wide bandgap semiconductor material can be a material having a bandgap of greater than about 2 eV. For example, wide bandgap semiconductors include materials such as GaAlAs, GaN, AlN, BN, GaAlAs, similar materials, and combinations thereof. A narrow bandgap semiconductor material can be a material having a bandgap of less than about 2 eV. For example, narrow bandgap semiconductors include material such as GaAs, Si, Ge, SiGe, InP, similar materials, and combinations thereof.

The integrated circuit 100 can be formed on a wafer, for example using lithographic processes as is known in the art. A wafer can be, for example, an insulator on which semiconductor materials are grown or deposited to produce electronic devices of an integrated circuit as is known in the art. Alternately, a wafer can provide semiconductor material which is doped, etched, and otherwise processed to produce electronic devices of an integrated circuit as is known in the art. For example, single crystal silicon wafers are commonly used for fabrication of MOSFET based integrated circuits.

One benefit of using JFETs is that these devices can be more easily produced on III-V or other heterogeneous semiconductor materials. Heterogeneous or compound semiconductors can include, for example, II-VI and III-V materials, including for example, SiGe, SiC, GaAs, InP, GaP, InGaAs, similar materials, and combinations thereof. Fabrication on heterogeneous wafers can be easier for JFETs, since gate oxides are not necessary. In contrast, using compound semiconductors for MOSFETs entails developing suitable gate dielectrics. Finding suitable gate dielectrics is greatly complicated by the ubiquitous interface states at the III-V semiconductor-oxide interface.

Other benefits of compound semiconductors can include larger mobilities and larger bandgaps to decrease gate leakage. For example, FIG. 2 includes gate current density estimates for enhancement-mode GaAs JFETs. The curves in FIG. 2 use constant values for the product of minority carrier diffusivity and effective intrinsic concentration, with $n_{ie}D$ of $10^{13}$ cm-4/s for electrons and $2 \times 10^{15}$ cm-4/s for holes, because for GaAs at very high doping levels, bandgap narrowing is counterbalanced by a widening due to degeneracy effects. At a given forward bias, these calculations give several orders of magnitude decrease in gate current density compared to silicon devices. Accordingly, GaAs-based JFETs can provide even greater benefits for low-power applications, which otherwise impose a minimum gate length of approximately 35 nm for silicon MOSFETs. Additionally, the larger bandgap of GaAs can greatly reduce leakage from band-to-band tunneling. The mobility of the channel can be increased by defining the channel bottom with a hetero-barrier and using "modulation" or "remote" doping. Using a smaller bandgap gate can significantly reduce gate injection into the JFET channel, though a larger bandgap in the gate depletion field may still be desirable to avoid band-to-band tunneling. Further modifications can include using high-mobility quantum wells to define the channel, which have been shown to lead to large transconductances.

It can be desirable to maintain the supply voltages for JFETs relatively low, for example less than about 1 V, or more particularly about 0.7 V. Accordingly, it can be desirable to include use other types of semiconductor devices for input/output circuitry 106 (FIG. 8) to enable higher interface voltages and/or current. For example, a silicon substrate may be used with silicon CMOS circuitry for input/output circuitry (e.g., input/output circuitry 106). A layer of GaAs can be deposited on the silicon substrate, and CJFETs fabricated on the GaAs layer to provide the main body (e.g., circuitry 102) of the integrated circuit. Accordingly, benefits of the reduced leakage of the JFETs can be obtained for most of the integrated circuit, and the higher voltage and current drive capabilities of MOSFETs obtained for the input/output circuitry.

Further advantages of JFETs over MOSFETs can be achieved at sizes near 10 nm. Scaling a 25 nm JFET design to near 10 nm can present challenges, such as leakage from band-to-band tunneling in the reverse-biased gate-drain junction. As mentioned above, however, use of a wide bandgap semiconductor for the channel and a low bandgap semiconductor for the drain can reduce the band-to-band tunneling. Replacing silicon with III-V semiconductors in JFETs can increase channel mobilities, for example, and expand the range of possible heterostructures. For example, silicon germanium alloys can be used in the channel to provide higher mobility. In contrast, such approaches do not appear practical for MOSFETs. Similar material changes under consideration for MOSFETs appear less practical as suitable gate insulators must be identified.

The basic enhancement-mode JFET can also benefit from technologies developed to scale MOSFET performance without changing the gate length. The raised gate can serve as an ion implantation mask for a halo implant to reduce short channel effects. Uniaxial strain can improve mobility. Fabricating a p-channel transistor on (110) silicon can decrease the effective mass and thus increase the hole current.

Furthermore, JFETs may effectively scale below the 10 nm barrier. For the JFET, constant field scaling indicates that the channel thickness can decrease from 12.5 nm to 5 nm, and the channel doping can increase to $N_d=3.1\times10^{19}$ cm$^{-3}$. Using the one-dimensional, one-sided abrupt junction model plotted in FIG. 2, with a 0.7 V reverse bias, band-to-band tunneling is thus on-the-order-of 100 kA/cm$^2$. If instead a linearly-graded junction model is used, then the estimate is on-the-order-of 1 kA/cm$^2$. This leakage can in part be reduced by using a less-conservative L/a≈1.5, enabled by a halo implant to control short channel effects, and allowing for a lower channel doping. Further reducing the doping gradient at the metallurgical junction also helps. For example, in the idealized limit of an undoped 10 nm layer between the gate and channel dopings, giving an electric field of approximately 1.7 MV/cm, the tunneling current would be on the order of 1 A/cm$^2$. This dopant gradient can be approximated by having the peak of the channel doping occur at the bottom of the channel, by not fully scaling the gate-drain setback, and by having the gate-channel metallurgical junction occur slightly up in the gate.

JFETs also lend themselves to modifications, such as double-gate and wraparound gate geometries, which have been investigated for MOSFETS. For example, a cylindrical geometry can help to control short channel effects. Nanowires grown with a catalyst naturally have this geometry. They allow much greater composition modulation than planar structures because the strain constraint is relaxed, and thus a greater range of electronic structure engineering. Radial heterostructures can therefore be used to engineer the gate leakage, and axial heterostructures to control the source-drain tunneling.

Figure 10:
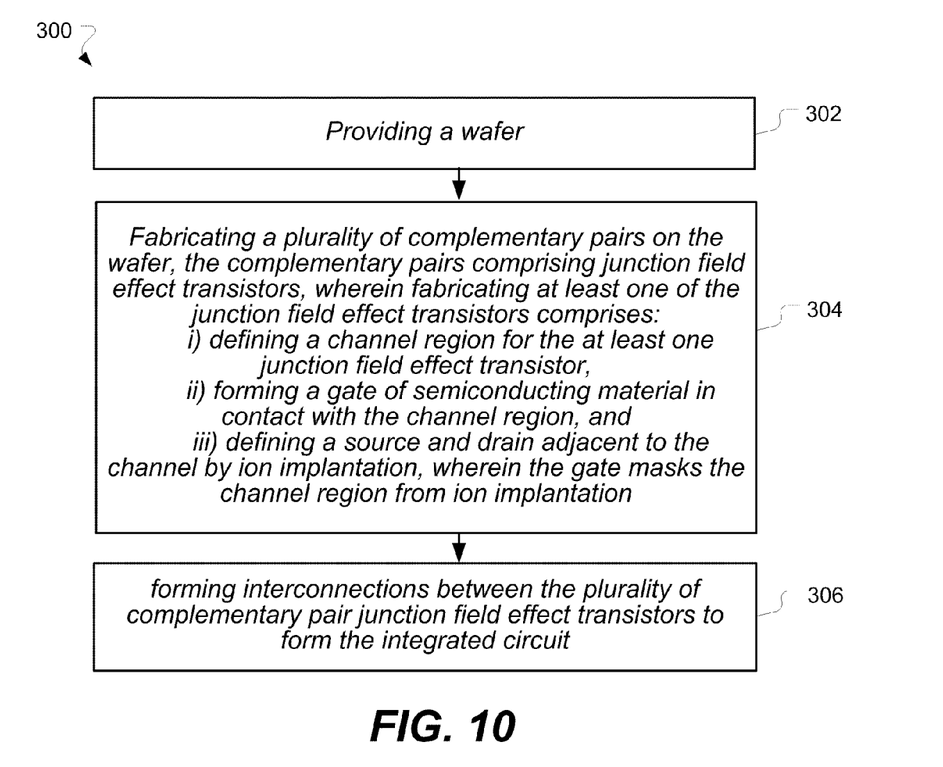
FIG. 10 is a flow chart of a method of fabricating an integrated circuit in accordance with some embodiments of the present invention.

FIG. 10 presents a high-level flow chart of a method of fabricating an integrated circuit. The method, shown generally at 300, can include providing 302 a wafer. As described above, various wafer types can be used. A plurality of complementary pairs can be fabricated on the wafer 304. Complementary pairs can include CJFETs as described above. Fabricating CJFETs can include a self-aligned gate process.

For example, fabricating 304 a CJFET can include defining a channel region. A gate can be formed of semiconducting material in contact with the channel region. Semiconducting material can be deposited using a process that grows, coats, or otherwise transfers a material onto the integrated circuit under construction. For example depositing materials can be performed by spin coating, physical vapor deposition (PVD), chemical vapor deposition (CVD), electrochemical deposition (ECD), molecular beam epitaxy (MBE), atomic layer deposition (ALD), and similar processes.

Forming the gate can include patterning the gate. In general, patterning includes changing the shape of deposited materials, for example, by using lithography. In lithography, the device is coated with a photoresist, the photoresist exposed through a mask, unexposed regions washed away by a developer solution, and etching or other processing used to remove the deposited material from the unexposed regions. Various lithography techniques are known and used in the semiconductor processing arts and can vary from the above sequence.

Etching can be performed, for example, by wet etching or dry etching such as reactive ion etch (RIE).

A source and drain can be defined adjacent to the channel by doping the semiconductor, for example, using ion implantation. In ion implantation, ions are accelerated and impinge onto the semiconductor. Regions can be masked from implantation using lithography as described above. In the self-aligned gate process, the gate masks the channel region from ion implantation, helping to reduce potential for misalignment between the gate, channel, source and drain. Using a self-aligned gate process helps to make fabrication of integrated circuits economical.

Non-uniform doping can be created within the channel using a halo implantation, where ion implantation is performed with the ions impinging onto a wafer, allowing some ion penetration into the channel underneath the gate.

Completing an integrated circuit typically includes forming 306 interconnections using metal interconnection layers. For example, multiple layers of insulating material (e.g., oxides or polymers) can separate multiple layers of conductive interconnection (e.g., aluminum or copper) that are patterned to define electrical traces interconnecting the electronic devices (e.g., transistors) into a functional integrated circuit.

If desired, additional steps can be performed to enhance electrical properties of the CJFETs. For example, uniaxial strain can be created within the channel (e.g., by creating lattice mismatches between the channel material and an underlying or overlying layer). The unixial strain can be oriented in a direction longitudinally along the channel (direction from source to drain). If desired, mobility within the channel can be enhanced by orienting the channel along a predetermined crystallographic axis of the wafer.

If desired, the integrated circuit can include other device types in addition to the CJFETs, including for example, MOSFET transistors, bipolar junction transistors, diodes, and the like. For example, a compound semiconductor layer may be deposited onto the substrate, and the CJFETs formed on the compound semiconductor layer, while other device types (e.g. MOSFETs) are formed on the substrate. Interconnection can be made between the CJFETs and MOSFETs. Processing steps for the other device types may be in addition to the processing steps used to form the CJFET, or some processing steps may be common to forming the CJFETs and the other devices.

Devices may also use a combination of MOSFETs and JFETS, allowing for the advantages of both devices to be obtained. For example, an inverter can be formed using a mixture of devices where a P-type MOSFET pull up transistor and N-type JFET pull down transistor are placed in a totem pole arrangement. Such an arrangement may be beneficial in that N-type JFETS can have lower leakage than N-type MOSFETS for small geometries while P-type MOSFETS may be comparable in leakage to P-type JFETS. Other arrangements of mixed transistor type logic gates having at least one JFET and at least one MOSFET can also be used.

Because JFETs at the nanometer scale may be compatible with MOSFETS, it is anticipated that translation of a MOSFET-based integrated circuit design into a CJFET-based integrated circuit design can be performed. Accordingly, a CJFET-based cell library can be provided to allow relatively straightforward translation of MOSFET-based designs into a CJFET-based design. For example, the CJFET-based cell may maintain a similar geometry (e.g. input/output points) and architecture (e.g. voltage/current levels) as the MOSFET-based cell.

Figure 11:
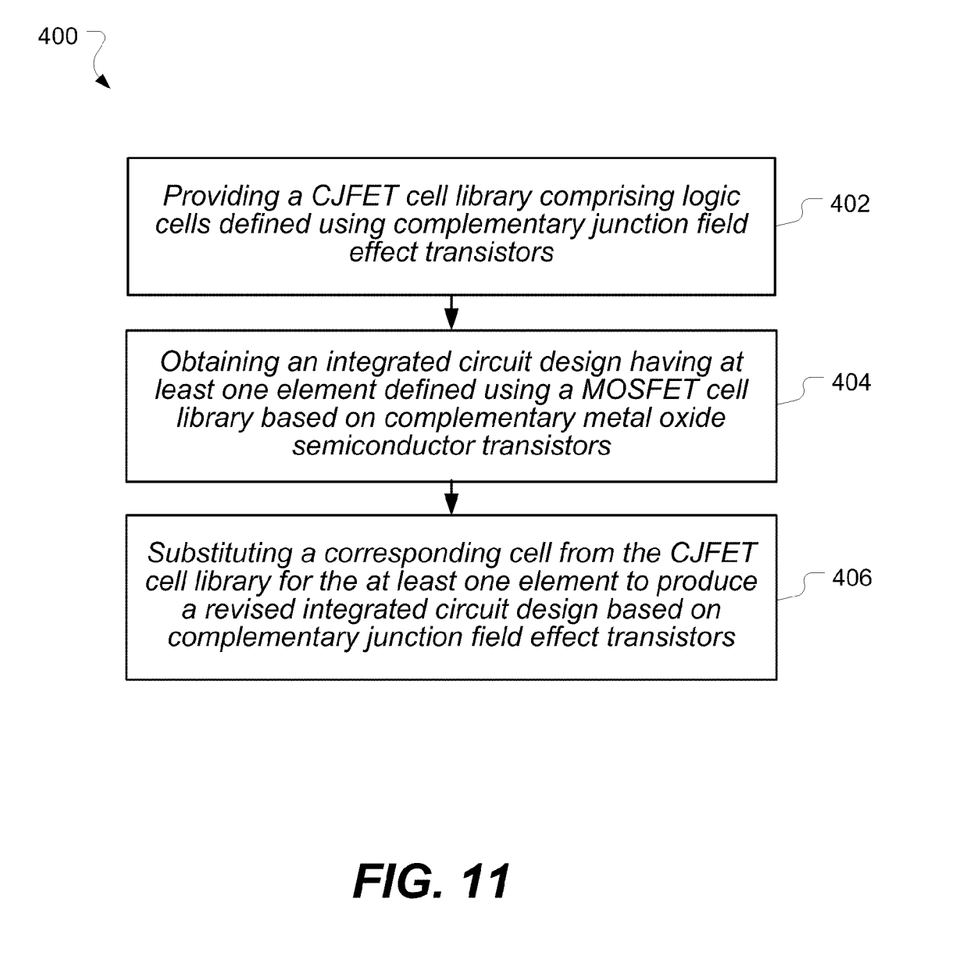
FIG. 11 is a flow chart of a method of designing an integrated circuit in accordance with some embodiments of the present invention.

FIG. 11 illustrates a flow diagram of a method of designing an integrated circuit. The method 400 can include providing 402 a CJFET cell library comprising logic cells defined using complementary junction field effect transistors. CJFET logic cells can be defined to correspond to each logic cell within an existing MOSFET cell library.

An integrated circuit design that is defined using a MOSFET cell library can be obtained 404, and then a cell-by-cell substitution 406 performed to translate the design into a revised CJFET-based integrated circuit design.

It is expected that such an approach may be feasible for CJFET cells having gate lengths between about 10 nm and about 30 nm for replacing similarly sized MOSFET transistors.

The revised integrated circuit design can then be fabricated to form an operational integrated circuit. The fabrication of the revised integrated circuit design can, for example, use techniques as described above.

Summarizing and reiterating to some extent, it has been recognized that JFETs may provide lower gate leakage than MOSFETs for gate lengths on the order of 40 nm or smaller, depending on the supply voltage and MOSFET gate insulator, while most other properties remain somewhat similar. Accordingly, JFETs may be substituted for MOSFETs in integrated circuit designs, and may be scaled even further to provide 10 nm or smaller devices. JFETs provide a number of fabrication advantages as compared to MOSFETs. In JFETs, no gate insulator is used, providing for a wider variety of semiconductors (e.g. compound semiconductors) which can be used. JFETs can be geometrically similar to MOSFETs, allowing for the possibility of replacement semiconductor cell libraries allowing for simple design changes by substituting CJFET-based logic cells for MOSFET-based logic cells.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

The invention claimed is:

1. An integrated circuit, comprising:
   a) a plurality of interconnected logic gates;
   b) at least one of the logic gates comprising a complementary pair of junction field effect transistors; and
   c) at least one of the junction field effect transistors comprising (i) a channel comprising a wide bandgap semiconductor material and (ii) a gate comprising a narrow bandgap semiconductor material.

2. The integrated circuit of claim 1, wherein the wide bandgap semiconductor material has a bandgap of greater than about 2 eV.

3. The integrated circuit of claim 1, wherein the wide bandgap semiconductor material is chosen from the group consisting of GaAlAs, GaN, AlN, BN, GaAlAs, and combinations thereof.

4. The integrated circuit of claim 1, wherein the narrow bandgap semiconductor material has a bandgap of less than about 2 eV.

5. The integrated circuit of claim 1, wherein the narrow bandgap semiconductor material is chosen from the group consisting of GaAs, Si, Ge, SiGe, InP, and combinations thereof.

6. The integrated circuit of claim 1, wherein the integrated circuit is formed on a wafer and the wafer is selected from the group of consisting of SiC, GaAs, InP, GaP, InGaAs, and combinations thereof.

7. The integrated circuit of claim 1, wherein the integrated circuit is formed on a wafer having a layer of compound semiconductor deposited thereon.

8. The integrated circuit of claim 1, wherein the channel has a length of less than about 40 nm.

9. The integrated circuit of claim 1, wherein the channel has a length of between about 10 nm and about 25 nm.

10. The integrated circuit of claim 1, wherein the channel has a non-uniform doping.

11. The integrated circuit of claim 1, wherein the channel is aligned along a predetermined crystallographic axis of the wafer.

12. The integrated circuit of claim 1, wherein the channel comprises uniaxial strain longitudinally within the channel.

13. The integrated circuit of claim 1, further comprising at least one complementary metal oxide semiconductor field effect transistor coupled to at least one of the logic gates to provide an input/output interface for the integrated circuit.

* * * * *